United States Patent [19]

Fukasawa

[11] Patent Number: 4,518,925
[45] Date of Patent: May 21, 1985

[54] SIGNAL PROCESSING CIRCUITS
[75] Inventor: Hideki Fukasawa, Kanagawa, Japan
[73] Assignee: Sony Corporation, Tokyo, Japan
[21] Appl. No.: 566,896
[22] Filed: Dec. 29, 1983
[30] Foreign Application Priority Data
  Dec. 30, 1982 [JP] Japan ............................. 57-198542
[51] Int. Cl.³ .......................... H03F 3/04; G11B 5/02
[52] U.S. Cl. ...................................... 330/51; 330/278; 360/67
[58] Field of Search ................ 330/51, 281, 285, 278, 330/141; 360/67, 68; 455/174, 194, 212
[56] References Cited
U.S. PATENT DOCUMENTS
  4,435,684 3/1984 Page ...................................... 330/51

Primary Examiner—James B. Mullins
Attorney, Agent, or Firm—Lewis H. Eslinger; Alvin Sinderbrand

[57] ABSTRACT

A signal processing circuit comprises an amplifying circuit portion having an input terminal connected to a signal source, an output terminal for delivering an amplifier signal therefrom and a control terminal, a capacitive device coupled to the control terminal for serving as a bypass capacitor for the amplifying circuit portion, a charging circuit portion connected to the control terminal for forming a path for a charging current to the capacitive device, a discharging circuit portion also connected to the control terminal for forming a path for a discharging current from the capacitive device, and a control circuit portion having a terminal supplied with a control signal taking at least first and second states and being operative to control both the charging and discharging circuit portions. The control circuit portion controls the charging circuit portion to allow the charging current to flow to the capacitive device so as to produce thereat a potential for making the amplifying circuit portion inoperative when the control signal is turned to take the first state and also control the discharging circuit portion to allow the discharging current to flow from the capacitive device so as to produce a potential thereat for making the amplifying circuit portion operative when the control signal is turned to take the second state.

8 Claims, 5 Drawing Figures

SIGNAL PROCESSING CIRCUITS

BACKGROUND OF THE INVENTION

This invention relates to a signal processing circuit used for an amplifier connected to a rotary magnetic head in a video tape recorder of the helically scanning type.

At a portion containing recording and reproducing amplifier circuits and a rotary magnetic head of a video tape recorder of the helically scanning type, the output terminal of the recording amplifier circuit and the input terminal of the reproducing amplifier circuit are in common connected through a rotary transformer to the rotary magnetic head, and the recording and reproducing amplifier circuits are supplied from the outside with a control voltage for controlling the operation of each circuit. In the recording operation of the video tape recorder, the control voltage is caused to take a prdetermined level so as to control the recording amplifier circuit to be operative and the reproduced amplifier circuit to be inoperative, and the rotary magnetic head is supplied with a recording current from the recording amplifier circuit. On the other hand, in the reproducing operation of the video tape recorder, the control voltage is caused to take another predetermined level so as to control the reproducing amplifier circuit to be operative and the recording amplifier circuit to be inoperative, and signals reproduced by the rotary magnetic head are derived through the reproducing amplifier circuit.

Such a reproducing amplifier circuit as mentioned above is usually constituted fundamentally as shown in FIG. 1. In this previously known circuit, an input terminal 11 is provided at the base of a transistor $Q_1$ at an amplifying stage, and the emitter of the transistor $Q_1$ is connected to the parallel connection of a constant current source 12 and a bypass capacitor 13, and a transistor $Q_c$ for supplying with a charging current to the bypass capacitor 13. Further, a control switch $S_c$ which is controlled to be turned on and off by a control voltage $V_c$ is connected to the emitter of the transistor $Q_c$.

In the recording operation of a video tape recorder employing the circuit shown in FIG. 1, the control switch $S_c$ is maintained to be conductive with a high level taken by the control voltage $V_c$ and consequently the transistor $Q_c$ is made conductive. A current flowing through the transistor $Q_c$ is supplied to the bypass capacitor 13 as the charging current and the bypass capacitor 13 is charged up to have a voltage of a level almost equal to a power supply voltage $V_{cc}$ across itself. As a result of this, the transistor $Q_1$ is maintained to be nonconductive so as not to perform amplifying operation. In the reproducing operation of the video tape recorder, the control switch $S_c$ is maintained to be nonconductive with a low level taken by the control voltage $V_c$ and consequently the transistor $Q_c$ is made nonconductive. In this case, the charge stored in the bypass capacitor 13 is discharged through the constant current source 12 so as to reduce the potential at the emitter of the transistor $Q_1$. As a result of this, the transistor $Q_1$ is turned on and maintained to be operative to perform amplifying operation.

Accordingly, with the previously proposed recording amplifier circuit as mentioned above, when the control voltage $V_C$ is changed to the high level from low level so that the video tape recorder is changed to be in the reproducing mode from the recording mode, the bypass capacitor 13 is charged up in an instant to have the voltage of the level sufficient to turn the transistor $Q_1$ off, so that the circuit is changed in a moment to be inoperative to perform an amplifying operation from operative to perform an amplifying operation. On the other hand, when the control voltage $V_C$ is changed to be the low level from the high level so that the video tape recorder is changed to be in the reproducing mode from the recording mode, it takes the bypass capacitor 13 a certain time to discharge to reduce the voltage across itself to be the level sufficient to turn the transistor $Q_1$ on, so that it takes the circuit the certain time to be changed to be operative to perform an amplifying operation from inoperative to perform an amplifying operation.

In general, the video tape recorder takes the recording mode and the reproducing mode on separate opportunities, respectively, and accordingly the fact that it takes the reproducing amplifier circuit a certain time to commence an amplifying operation after the inoperative state as mentioned above may not cause any particular problem. In a specific case mentioned below, however, this fact is disadvantageous.

A video tape recorder is required to be capable of performing a long time recording operation as one of desirabilities thereof. For complying with this requirement, the running speed of a magnetic tape is reduced so as to make a video track thereon narrow in width. With this treatment, however, the recording characteristics for an audio signal is deteriorated and further tracking control a rotary magnetic head in the reproducing mode is made difficult to be appropriately achieved. Accordingly, it has been proposed to take particular measures generally called a dynamic tracking method to realize the long time recording operation. With the dynamic tracking method, in recording, an audio signal is suppressed in time and recorded in an end portion of each video track separately from a video signal and a pilot signal used for tracking control is frequency-superimposed on the video signal and recorded in each video track, and in reproducing, the rotation path of a rotary magnetic head is controlled with tracking error information obtained from a reproduced pilot signal.

In a video tape recorder employing such particular measures, a magnetic tape is wound on a head drum in an angular area thereon of, for example, larger by 30 degrees than 180 degrees, that is, 210 degrees, and a pair of rotary magnetic heads $H_A$ and $H_B$ which are mounted at angular positions distant by 180 degrees from each other come into contact with the magnetic tape during each scanning period corresponding to one and one sixth (7/6) field periods and having overlapping end portions provided between each two successive scanning periods, so as to scan the magnetic tape alternately every field period. With such scanning, an audio signal $S_A$ suppressed in time is recorded by one of the rotary magnetic heads $H_A$ and $H_B$ during a period corresponding to one sixth (1/6) field periods contained in the beginning portion of each scanning period of 7/6 field periods, and a video signal $S_V$ accompanied with a pilot signal $S_P$ which is frequency-superimposed on the video signal $S_V$ is recorded by the same rotary magnetic head during a successive period corresponding to one field period 1F in each scanning period, as shown at X in FIG. 2. Accordingly, as shown in FIG. 3, on the magnetic tape which is scanned by the rotary magnetic heads $H_A$ and $H_B$ in the direction shown with an arrow in FIG. 3, the audio signal $S_A$ suppressed in time is recorded in a portion $T_A$ corresponding to 1/6 field periods of each record track slanted to the direction of tape running at the beginning thereof, and the video signal $S_V$ and the pilot signal $S_P$ are recorded in the remaining portion $T_V$ corresponding to one field of the same record track. In this case, the pilot signal $S_P$ has repeatedly four different frequencies $f_1$, $f_2$, $f_3$ and $f_4$ in each successive four field periods, respectively. The sudio signal $S_A$ suppressed in time is formed into a pulse code modulation signal and then recorded, for example, in the NRZ modulation.

In the case of such particular measures, as shown at Y in FIG. 2, when the video signal $S_V$ and the pilot signal $S_P$, which are previously recorded in the portion $T_V$ of each record track marked with P in FIG. 2, are reproduced and the audio signal $S_A$ suppressed in time is recorded in the portion $T_A$ of each record track marked with R in FIG. 2 with monitoring a picture obtained in response to the reproduced video signal $S_V$, that is, the after recording of the audio signal $S_A$ suppressed in time is performed, recording and reproducing amplifier circuits connected to each of the rotary magnetic heads $H_A$ and $H_B$ are required to be changed so that the recording amplifier circuit is operative, while the reproducing amplifier circuit is inoperative during the period in which the rotary magnetic head $H_A$ or $H_B$ scans the portion $T_A$ of each record track, and the recording amplifier circuit is inoperative, while the reproducing amplifier circuit is operative during the period in which the rotary magnetic head $H_A$ or $H_B$ scans the portion $T_V$ of each record track successive to the portion $T_A$ thereof. In such changes to the recording mode from the reproducing mode or vice versa in respect of the recording and reproducing amplifier circuits, although the change to the recording mode from the reproducing mode is not required to be achieved in a moment but suffices it to be completed within a period in which the rotary magnetic head $H_A$ or $H_B$ is not in contact with the magnetic tape, the change to the reproducing mode from the recording mode is required to be achieved in an instant because the portion $T_V$ is continuous to the portion $T_A$ in each record track. Accordingly, on the occasion of the change to the reproducing mode from the recording mode, it is required that the recording amplifier circuit is changed to be inoperative from operative in a moment and simultaneously the reproducing amplifier circuit is changed to be operative from inoperative in a moment.

However, since the conventional reproducing amplifier circuit shown in FIG. 1 contains the bypass capacitor 13 which is discharged through the constant current source 12, it takes the circuit a certain time to be changed to be operative to perform an amplifier operation from inoperative to perform an amplifying operation, as described above. As a result of this, with such a conventional reproducing amplifier circuit, the video signal $S_V$ and the pilot signal $S_P$ may not be reproduced from the beginning part of each portion $T_V$ on the occasion of the after recording of the audio signal $S_A$.

In the case where the portion $T_A$ of each recording track is arranged to correspond to more than one field period and the video signal $S_V$ is recorded in both the finishing part of one of the portions $T_V$ and the beginning part of the next of the portions $T_V$, it is possible to obtain a continuously reproduced video signal even though the video signal $S_V$ is not reproduced from the beginning part of each portion $T_V$. In such a case, an allowable duration of a period in which the video signal $S_V$ is not reproduced from the beginning part of each portion $T_V$ may be limited practically to be equivalent to less than two horizontal periods. However, in the case of the conventional reproducing amplifier circuit shown in FIG. 1, since the bypass capacitor 13 is required to have the capacitive value of about 0.22 $\mu$F in order to allow the reproduced pilot signal $S_P$ having the lowest frequency of about 100 kHz of the aforementioned frequencies $f_1$, $f_2$, $f_3$ and $f_4$ to pass therethrough and discharged through the constant current source 12, it takes the circuit a time corresponding to more than two horizontal periods to be changed to be operative from inoperative.

OBJECTS AND SUMMARY OF THE INVENTION

Accordingly, it is an object of the present invention to provide a signal processing circuit sutable for constituting a reproducing amplifier in a video tape recorder, which can avoid the above described disadvantages of the prior art.

Another object of the present invention is to provide a signal processing circuit suitable for being used as a reproducing amplifier circuit in a video tape recorder, which can be changed to be operative to perform a amplifying operation from inoperative to perform an amplifying operation in a moment by a control voltage supplied thereto from the outside.

According to an aspect of the present invention, there is provided a signal processing circuit comprising an amplifying circuit portion having an input terminal connected to a signal source, an output terminal for delivering an amplified signal and a control terminal; a capacitive device coupled to the control terminal of the amplifying circuit portion for serving as a bypass capacitor for the latter; charging and discharging circuit portions both connected to the control terminal of the amplifying circuit portion; and a control circuit portion having a control signal input terminal supplied with a control signal taking at least first and second states and being operative to control the charging and discharging circuit portions, said control circuit portion causing the charging circuit portion to form a circuit path for charging the capacitive device to have a voltage sufficient to make the amplifying circuit portion inoperative when the control signal is turned to take the first state and causing the discharging circuit portion to form a circuit pathe for discharging the capacitive device to have a voltage sufficient to make the amplifying circuit portion operative when the control signal is turned to take the second state.

In the signal processing circuit thus constituted in accordance with the present invention, the amplifying circuit portion is controlled by the capacitive device, which is qiuckly charged through the charging circuit portion and quickly discharged through the discharging circuit portion so as to be changed to be operative from inoperative in an instant in response to the control signal. Consequently, in the case where the signal processing circuit is used as a reproducing amplifier circuit of a video tape recorder employing such particular measures as aforementioned in which previously recorded video and pilot signals are reproduced from a first portion of each record track on a magnetic tape and an audio signal suppressed in time is recorded in a second portion of each record track from which the first portion elongates with monitoring a picture obtained in response to the reproduced video signal, the video and pilot signals can be surely reproduced from the whole first portion including the beginning part thereof successive to the second portion.

The above and other objects, features and advantages of the present invention will become apparent from the following detailed description thereof in conjunction with the accompanying drawings.

PREFERRED EMBODIMENT OF THE INVENTION

Figure 4:
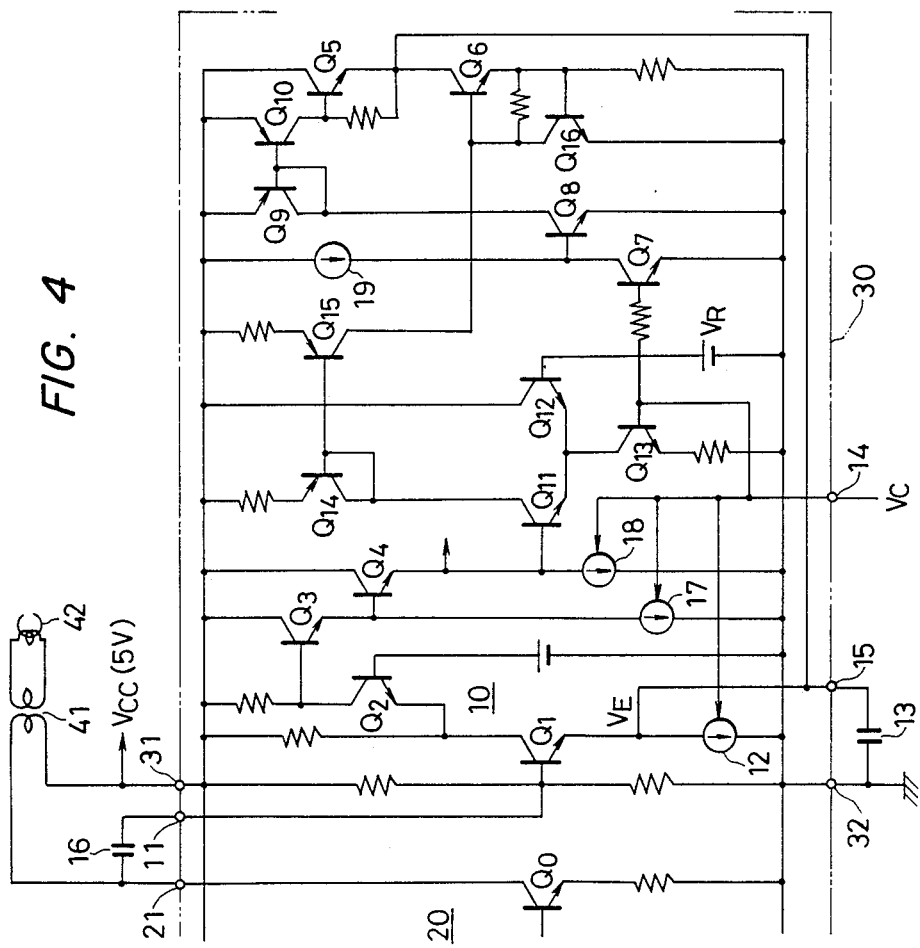
FIG. 4 is a schematic circuit diagram showing an embodiment of signal processing circuit according to the present invention.

FIG. 4 shows an example of a signal processing circuit according to the present invention. This example is used for constituting a recording amplifier circuit of a video tape recorder. The reproducing amplifier constituted by the signal processing circuit according to the present invention, which is marked with 10, is formed into an integrated circuit 30 together with a recording amplifier circuit 20 on a common semiconductor substrate. The integrated circuit 30 has an input terminal 11 provided at the base of a transistor $Q_1$ forming an amplifying stage of the reproducing amplifier circuit 10, an output terminal 21 provided at the collector of an amplifying transistor $Q_0$ forming a final stage of the recording amplifier circuit 20, a power supplying terminal 31, a ground terminal 32, a control terminal 14 through which a control voltage $V_C$ is supplied to the reproducing amplifier circuit 10 from the outside, and a terminal 15 provided at the emitter of the transistor $Q_1$. At the outside of the integrated circuit 30, a capacitor 16 is connected between the input terminal 11 and the output terminal 21, and a rotary transformer 41 to which a rotary magnetic head 42 is coupled is connected between the output terminal 21 and the power supplying terminal 31.

In the reproducing amplifier circuit 10, the transistor $Q_1$ and transistors $Q_2$ to $Q_4$ form an amplifying portion having an output terminal provided at the emitter of the transistor $Q_4$ from which an amplified signal is derived, and a constant current source 12 is connected to the emitter of the transistor $Q_1$. A bypass capacitor 13 for the amplifying portion comprising the transistors $Q_1$ to $Q_4$ is connected between the terminal 15 and the ground terminal 32. Constant current sources 17 and 18 are connected to the emitters of the transistors $Q_3$ and $Q_4$, respectively. Further, a transistor $Q_5$ for forming a path for a charging current supplied to the bypass capacitor 13 is connected between the power supplying terminal 31 and the transistor $Q_1$, and a transistor $Q_6$ for forming a path for a discharging current flowing from the bypass capacitor 13 is connected between the emitter of the transistor $Q_1$ and the ground terminal 32 in parallel with the bypass capacitor 13. In regard to the transistor $Q_5$ forming the path for the charging current, a control portion comprising transistors $Q_7$ to $Q_{10}$ and a constant current source 19 is provided for controlling the transistor $Q_5$ to be conductive and nonconductive in response to the control voltage $V_C$ supplied to the control terminal 14, and in regard to the transistor $Q_6$ forming the path for the discharging current, a control portion comprising transistors $Q_{11}$ to $Q_{15}$ is provided for controlling the transistor $Q_6$ to be conductive and non-conductive in response to both the control voltage $V_C$ supplied to the control terminal 14 and the potential at the emitter of the transistor $Q_4$. A transistor $Q_{16}$ is provided for limiting the discharging current flowing through the transistor $Q_6$.

The capacitive value of the bypass capacitor 13 is selected to be 0.22 $\mu$F by way of example, and therefore, assuming that the emitter resistance of the transistor $Q_1$ is about 13 $\Omega$, a lower cut-off frequency of the amplifying portion comprising the transistors $Q_1$ to $Q_4$ is determined to be approximately 56 kHz. This results in that the amplifying portion comprising the transistors $Q_1$ to $Q_4$ can treat a signal having a frequency corresponding to the lowest frequency of the pilot signal $S_P$ as aforementioned when the transistors $Q_1$ to $Q_5$ are conductive.

Figure 2:
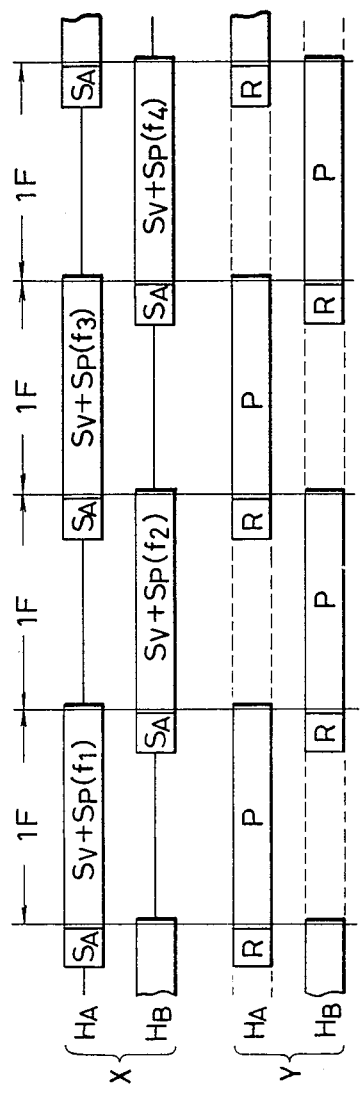
FIGS. 2 and 3 are illustrations used for explaining particular measures for recording and reproducing in a video tape recorder and the after recording of an audio signal in the video tape recorder.
Figure 3:
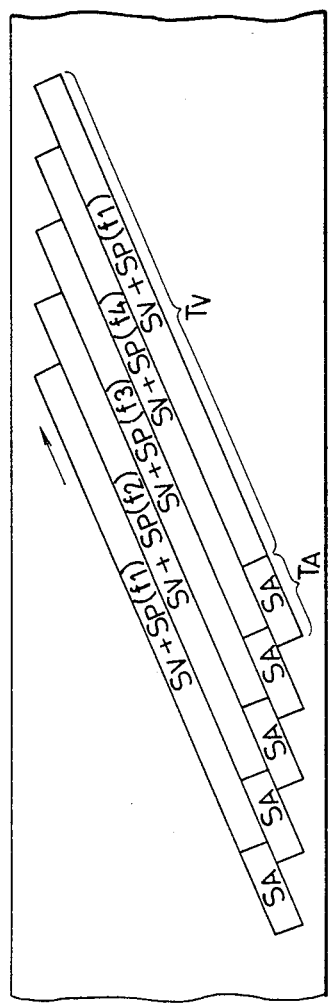
Figure 1:
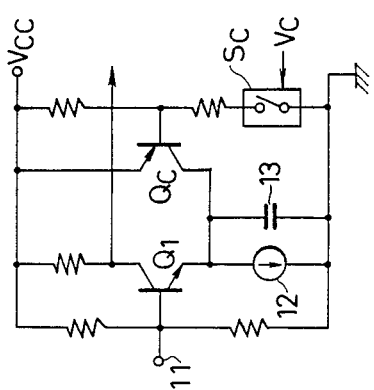
FIG. 1 is a schematic circuit diagram showing a previously known reproducing amplifier circuit.
Figure 5:
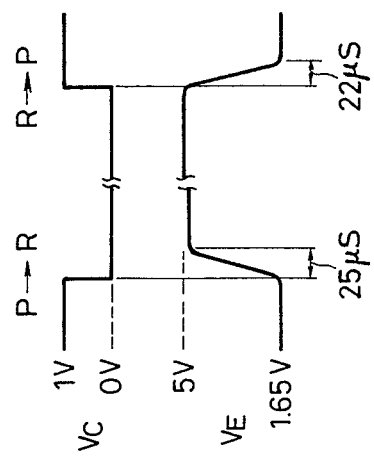
FIG. 5 shows waveform diagrams used for explaining the operation of the signal processing circuit shown in FIG. 4.

In the reproducing amplifier circuit 10 thus constituted, when the control voltage $V_C$ is changed to be ground level (0V) from 1 V, by way of example, as shown in FIG. 5 in order to change the circuit 10 to be in the recording mode from the reproducing mode, the constant current sources 12, 17 and 18 in the amplifying portion are turned off and the transistors $Q_{13}$ and $Q_7$ are also turned off. When the transistor $Q_{13}$ is turned off, the transistors $Q_{14}$ and $Q_{15}$ are turned off, and as a result, the transistor $Q_6$ is also turned off. Further, when the transistor $Q_7$ is turned off, the transistor $Q_8$ is turned on and the transistors $Q_9$ and $Q_{10}$ are also turned on, and as a result, the transistor $Q_5$ is turned on. Accordingly, the charging current flows through the transistor $Q_5$ to the bypass capacitor 13 and the bypass capacitor 13 is charged up to have a voltage which rises the emitter potential $V_E$ of the transistor $Q_1$ to a level almost equal to the power supply voltage $V_{cc}$ of 5 V by way of example, as shown in FIG. 5.

With this voltage obtained across the bypass capacitor 13, the transistor $Q_1$ is turned off and consequently the amplifying portion is made inoperative. In this situation, the transistors $Q_3$ and $Q_4$ remain conductive and the base potential of the transistor $Q_{11}$, which forms in cooperation with the transistor $Q_{12}$, a voltage comparator in the control portion provided in regard to the transistor $Q_6$, becomed more than 3.6 V, by way of example, in this case.

The charging current flowing through the transistor $Q_5$ to the bypass capacitor 13 which is selected to be 0.22 $\mu$F is set to be 24 mA by way of example. In such a case, the emitter potential $V_E$ of the transistor $Q_1$ reaches about 5 V in 25 micro seconds after the control voltage $V_C$ is changed to be ground level, as shown in FIG. 5, and accordingly the amplifying portion is changed to be inoperative to perform an amplifying operation in a moment.

When the control voltage $V_C$ is changed to be 1 V from ground level by way of example, as shown in FIG. 5, in order to change the circuit 10 to be in the reproducing mode from the recording mode, the constant current sources 12, 17 and 18 in the amplifying portion are turned on and the transistors $Q_7$ and $Q_{13}$ are also turned on. When the transistor $Q_7$ is turned on, the transistor $Q_8$ is turned off and the transistors $Q_9$ and $Q_{10}$ are also turned off, and as a result, the transistor $Q_5$ is turned off. Further, when the transistor $Q_{13}$ is turned on, the voltage comparator composed of the transistors $Q_{11}$ and $Q_{12}$ in the control portion provided in regard to the transistor $Q_6$ becomes operative. At an instant at which the control voltage $V_C$ is changed to be 1 V from ground level, since the base potential of the transistor $Q_{11}$ is more than 3.6 V as aforementioned and higher than a reference potential $V_R$, which is set to be 3.1 V by way of example, applied to the base of the transistor $Q_{12}$, the transistor $Q_{11}$ is turned on and the transistor $Q_{12}$ is turned off. Consequently, the transistors $Q_{14}$ and $Q_{15}$ are turned on and the transistor $Q_6$ is also turned on so that the discharging current from the bypass capacitor 13 flows through the transistor $Q_6$. The discharging current from the bypass capacitor 13 also flows through the constant current source 12 simultaneously. As a result of this, the emitter potential $V_E$ of the transistor $Q_1$ is reduced to turn the transistor $Q_1$ on. At the same time, the transistor $Q_2$ is also turned on and the amplifying portion comprising the transistors $Q_1$ to $Q_4$ is turned to be operative to perform an amplifying operation.

When the transistors $Q_1$ and $Q_2$ are turned on, the emitter potential of the transistor $Q_4$, that is, the base potential of the transistor $Q_{11}$ is reduced to turn the transistor $Q_{11}$ off and the transistor $Q_{12}$ on. Accordingly, the transistors $Q_{14}$ and $Q_{15}$ are turned off, and therefore the transistor $Q_6$ is turned off, so that the discharging of the bypass capacitor 13 stops and the bypass capacitor 13 is in the stable state. In this condition, the emitter potential $V_E$ is set to be 1.65 V by way of example, as shown in FIG. 5, and the base potential of the transistor $Q_{11}$ is set to be 2.4 V by way of example and lower than the reference potential $V_R$ of 3.1 V applied to the base of the transistor $Q_{12}$.

Further, the discharging current flowing through the transistor $Q_6$ from the bypass capacitor 13 which is selected to be 0.22 $\mu F$ as aforementioned is set to be 32 mA by way of example, and the constant current of the constant current source 12 is set to be 2 mA by way of example. In such a case, the emitter potential $V_E$ of the transistor $Q_1$ reaches about 1.65 V in 22 micro seconds after the control voltage $V_C$ is changed to be 1 V from ground level, as shown in FIG. 5, and accordingly the amplifying portion is changed to be operative to perform an amplifying operation in an instant.

It is possible to have such an arrangement that the emitter potential $V_E$ of the transistor $Q_1$ is compared directly with the reference potential $V_R$ at the voltage comparator composed of the transistors $Q_{11}$ and $Q_{12}$ in the control portion provided in regard to the transistor $Q_6$. In such a case, however, since variations in the emitter potential $V_E$ of the transistor $Q_1$ are relatively small, the reference potential $V_R$ must be set quite accurately. In view of this fact, it is preferable to have such an arrangement as shown in FIG. 4 in which the potential corresponding to the voltage amplified by the amplifying portion comprising the transistor $Q_1$ to $Q_4$ is compared with the reference potential $V_R$ at the voltage comparator composed of the transistors $Q_{11}$ and $Q_{12}$.

Incidentally, the constant current source 12 can be replaced with an appropriate resistor.

In the reproducing amplifier circuit constituted by the embodiment of the present invention as described above, the transistor $Q_6$ for forming the path for the discharging current from the bypass capacitor 13 is provided in parallel with the bypass capacitor 13 connected to the emitter of the transistor $Q_1$ which forms, in coorporation with the other transistors, the amplifying portion and this transistor $Q_6$ is turned on to allow the discharging current from the bypass capacitor 13 to flow therethrough when the control voltage $V_C$ is changed to be a certain predetermined level from another predetermined level. Accordingly, the transistor $Q_1$ is quickly turned off in response to the change in the control voltage $V_C$ and consequently the reproducing amplifier circuit is changed to be operative to perform an amplifying operation from inoperative to perform an amplifying operation in a moment when the control voltage $V_C$ is changed.

What is claimed is:

1. A signal processing circuit for supplying with an amplified output signal, comprising;
    amplifying circuit means having an input terminal connected to a signal source, an output terminal for delivering the amplified output signal threrfrom, and a control terminal,
    capacitive means coupled to the control terminal of said amplifying circuit means for serving as a bypass capacitor for said amplifying circuit means,
    charging circuit means connected to the control terminal of said amplifying circuit means for forming a path for a charging current to said capacitive means,
    discharging circuit means connected to the control terminal of said amplifying circuit means for forming a path for a discharging current from said capacitive means, and
    controlling circuit means having a control signal input terminal supplied with a control signal taking at least first and second states, and being operative to control said charging circuit means to allow the charging current to flow to said capacitive means so as to produce thereat a potential for making said amplifying circuit means inoperative when said control signal is turned to take the first state and control said discharging circuit means to allow the discharging current to flow from said capacitive means to as to produce thereat a potential for making said amplifying circuit means operative when the control signal is turned to take the second state.

2. A signal processing circuit according to claim 1, wherein said controlling circuit means comprises first control means for controlling said charging circuit means and second control means for controlling said discharging circuit means.

3. A signal processing circuit according to claim 2, wherein said second control means includes a comparator for comparing a variable potential obtained in response to a potential at the control terminal of said amplifying circuit means with a reference potential and producing an output of a result of the comparision to control therewith said discharging circuit means.

4. A signal processing circuit according to claim 3, wherein said variable potential is derived from the output terminal of said amplifying circuit means.

5. A signal processing circuit according to claim 1, wherein said amplifying circuit means includes an amplifying transistor having a base connected to the input terminal and an emitter connected to the control terminal, and said capacitive means comprises a capacitor connected to the emitter of said transistor.

6. A signal processing circuit according to claim 5, wherein said amplifying circuit means further includes at least one additional transistor connected between a collector of said amplifying transistor and the output terminal.

7. A signal processing circuit according to claim 1, wherein said signal source comprises transducer means employed in recording and reproducing apparatus from which a reproduced signal is supplied.

8. A signal processing circuit according to claim 7, said control signal supplied to the control signal input terminal of said controlling circuit means takes the first and second states selectively in response to the recording mode and the reproducing mode in said recording and reproducing apparatus, respectively.

* * * * *